United States Patent [19]
Shirley

[11] Patent Number: 6,097,644
[45] Date of Patent: Aug. 1, 2000

[54] REDUNDANT ROW TOPOLOGY CIRCUIT, AND MEMORY DEVICE AND TEST SYSTEM USING SAME

[75] Inventor: Brian Shirley, Boise, Id.

[73] Assignee: Micron Technology, Inc., Boise, Id.

[21] Appl. No.: 09/255,069

[22] Filed: Feb. 22, 1999

[51] Int. Cl.[7] ........................................................ G11C 7/00
[52] U.S. Cl. ........................................ 365/200; 365/225.7
[58] Field of Search ................................ 365/200, 225.7, 365/201

[56] References Cited

U.S. PATENT DOCUMENTS 5,218,572   6/1993   Lee et al. ................................. 365/200

*Primary Examiner*—David Nelms
*Assistant Examiner*—M. Tran
*Attorney, Agent, or Firm*—Dorsey & Whitney LLP

[57] ABSTRACT

An integrated circuit includes a memory-cell array having a plurality of memory cells arranged in rows and columns. The memory-cell array includes at least one redundant memory cell, each of the memory cells having an associated data topology. A data path circuit transfers data between an external terminal and the memory-cell array. The data path circuit sets the data topology between data on the external terminal and data at the array responsive to a data topology signal. An address decoder receives an address applied on an address bus and further receives a matching signal. The address decoder accesses memory cells in the memory-cell array responsive to the address and matching signals. A data topology circuit is coupled to the address decoder and the data path circuit, and includes a programmable topology element. In response to the address having a predetermined value, the data topology circuit applies the matching signal to the address decoder to access a predetermined redundant memory cell in the array. The data topology circuit further operates responsive to the matching signal going active and the state of the programmable topology element to apply the data topology signal to the data path circuit to adjust the data topology of the accessed redundant memory cell.

27 Claims, 3 Drawing Sheets

REDUNDANT ROW TOPOLOGY CIRCUIT, AND MEMORY DEVICE AND TEST SYSTEM USING SAME

TECHNICAL FIELD

The invention relates generally to electronic circuits, and more particularly to a circuit and method for replacing defective memory cells in a memory device with redundant memory cells having the same data topology as the replaced memory cells.

BACKGROUND OF THE INVENTION

A typical semiconductor memory device includes a memory-cell array containing a plurality memory cells arranged in rows and columns. The memory cells in the array are typically tested and, if necessary, repaired before the memory devices are shipped to customers. During testing of the memory device, any of the memory cells that is found to be defective is replaced with a redundant memory cell. The entire row or column containing the defective memory cell is typically replaced with a redundant row or column, respectively. In the following description, it will be assumed that a row containing a defective memory cell is replaced with a redundant row. To replace a row containing a defective memory cell, a row address decoder is programmed to map a redundant row to the address of the row containing the defective memory cell, and to disable data access to the row containing the defective memory cell. Therefore, when an external circuit reads data from or writes data to this detective row address, the row address decoder does not activate the defective row, but instead activates the redundant row so that data may be transferred to or from a corresponding addressed memory cell within the redundant row. This rerouting of the defective row address to the redundant row is often called the repair solution for the memory-cell array.

Replacing defective rows with redundant rows as described above presents a difficulty for thereafter testing the memory cells due to the potential differences between the "data topologies" of the defective and redundant rows. The data topology of a particular row of memory cells defines the relationship between external logic levels applied on a data bus of the memory device and the resulting logic level signals applied on digit lines coupled to the memory cells, as will now be described in more detail with reference to FIG. 1. FIG. 1 is a schematic of a portion of a memory-cell array 10 in a conventional dynamic random access memory ("DRAM"). The memory-cell array 10 includes a primary array 11 having N rows of memory cells 12, the memory cells in each row being coupled to a corresponding word line WL1-WLN. The memory-cell array 10 further includes a redundant array 13 having M rows of memory cells 14, the memory cells in each row being coupled to a corresponding redundant word line RWL1-RWLM. Typically, the rows of memory cells 14 in the redundant array 13 are merely additional rows of memory cells in the primary array 11 that are utilized to replace defective rows in the primary array 11, as will be explained in more detail below. Each of the memory cells 12 and 14 includes a corresponding access transistor 16 and storage capacitor 18 coupled in a conventional manner as shown.

The primary array 11 and redundant array 13 share common complementary digit lines D and $\overline{D}$, each memory cell 12,14 in a particular column being coupled to one of the complementary digit lines as shown. The array 10 is a conventional folded-digit-line architecture so the memory cells 12, 14 in each odd row are coupled to digit line D, and the memory cells 12, 14 in each even row are coupled to the complementary digit line $\overline{D}$. For example, each memory cell 12 coupled to the word line WL1 is coupled to the corresponding digit line D while each memory cell 12 coupled to the word line WL2 is coupled to the corresponding complementary digit line $\overline{D}$. A sense amplifier 15 senses data stored in an addressed memory cell 12, 14 coupled to one of the complementary digit lines D and $\overline{D}$ as understood by those skilled in the art.

During testing of the array 10, a memory tester (not shown) must apply appropriate logic level signals on external data bus lines (not shown) of the memory device so that the proper logic level signals are applied on the digit lines D and $\overline{D}$ and thereafter transferred to the addressed memory cell 12, 14. In other words, the memory tester must determine the data topology for each row so that the logic level signals applied on the external data bus result in the desired logic level signals being applied on the digit lines D and $\overline{D}$. For example, suppose the memory tester must transfer a logic 1 to each memory cell 12 and 14, and that a logic 1 corresponds to a positive voltage of $V_{cc}/2$ being stored across the storage capacitor 18. Further assume the tester must drive a logic 1 onto an external data pin to force the sense amplifier 15 to drive a logic 1 onto the digit line D and a logic 0 onto the digit line $\overline{D}$, and a logic 0 onto the external data pin to force the sense amplifier to drive a logic 0 onto line D and a logic 1 onto line $\overline{D}$. In this situation, the memory tester must adjust for the different row topologies of even and odd rows. When the tester is addressing odd rows, the tester must apply a logic 1 on the external data pin to cause a logic 1 to be applied on the digit lines D and thereafter transferred to the memory cells 12, 14 in the addressed odd row. In contrast, if the memory tester is addressing an even row, the tester must apply a logic 0 on the external data pin in order to cause a logic 1 to be applied on the digit lines $\overline{D}$ and then transferred into the memory cells 12, 14 in the addressed even row.

When replacing a defective row with a redundant row, a change in data topology can result if the topologies between the rows are different. As a result, the memory tester must also determine such changes in data topology resulting from the replacement of defective rows with redundant rows of the opposite data topology. A memory tester capable of storing and adjusting for such data topology changes would be a relatively expensive piece of test equipment. Moreover, during testing after defective rows have been replaced, a plurality of memory devices are typically tested in parallel. Therefore, even if an expensive memory tester capable of storing the changes in data topologies is used, it would have to store the different topologies for each of the memory devices being tested in parallel. Unfortunately, even the most sophisticated testers often lack the ability to store such multiple data topologies for the respective memory devices under test. Furthermore, even if a memory tester could store multiple topologies, the time required to calculate and store the topology for each memory device could be long enough to considerably slow down the "throughput" of the tester. Similarly, if circuitry were included in the memory device to calculate the data topologies such circuitry would be relatively complex and thus occupy valuable area on the device.

There is a need for replacing defective rows of memory cells in memory devices with redundant rows while maintaining the same row topology between the defective and redundant rows.

SUMMARY OF THE INVENTION

According to one aspect of the present invention, an integrated circuit includes a memory-cell array having a plurality of memory cells arranged in rows and columns. The memory-cell array includes at least one redundant memory cell, each of the memory cells having an associated data topology. A data path circuit transfers data between an external terminal and the memory-cell array. The data path circuit sets the data topology between data on the external terminal and data at the array responsive to a data topology signal. An address decoder receives an address applied on an address bus and further receives a matching signal. The address decoder accesses memory cells in the memory-cell array responsive to the address and matching signals. A data topology circuit is coupled to the address decoder and the data path circuit, and includes a programmable topology element. In response to the address having a predetermined value, the data topology circuit applies the matching signal to the address decoder to access a predetermined redundant memory cell in the array. The data topology circuit further operates responsive to the matching signal going active and the state of the programmable topology element to apply the data topology signal to the data path circuit to adjust the data topology of the accessed redundant memory cell. The integrated circuit may, for example, be a semiconductor memory device such as a dynamic random access memory ("DRAM"), and the programmable topology element can be an antifuse.

DETAILED DESCRIPTION OF THE INVENTION

Figure 1:
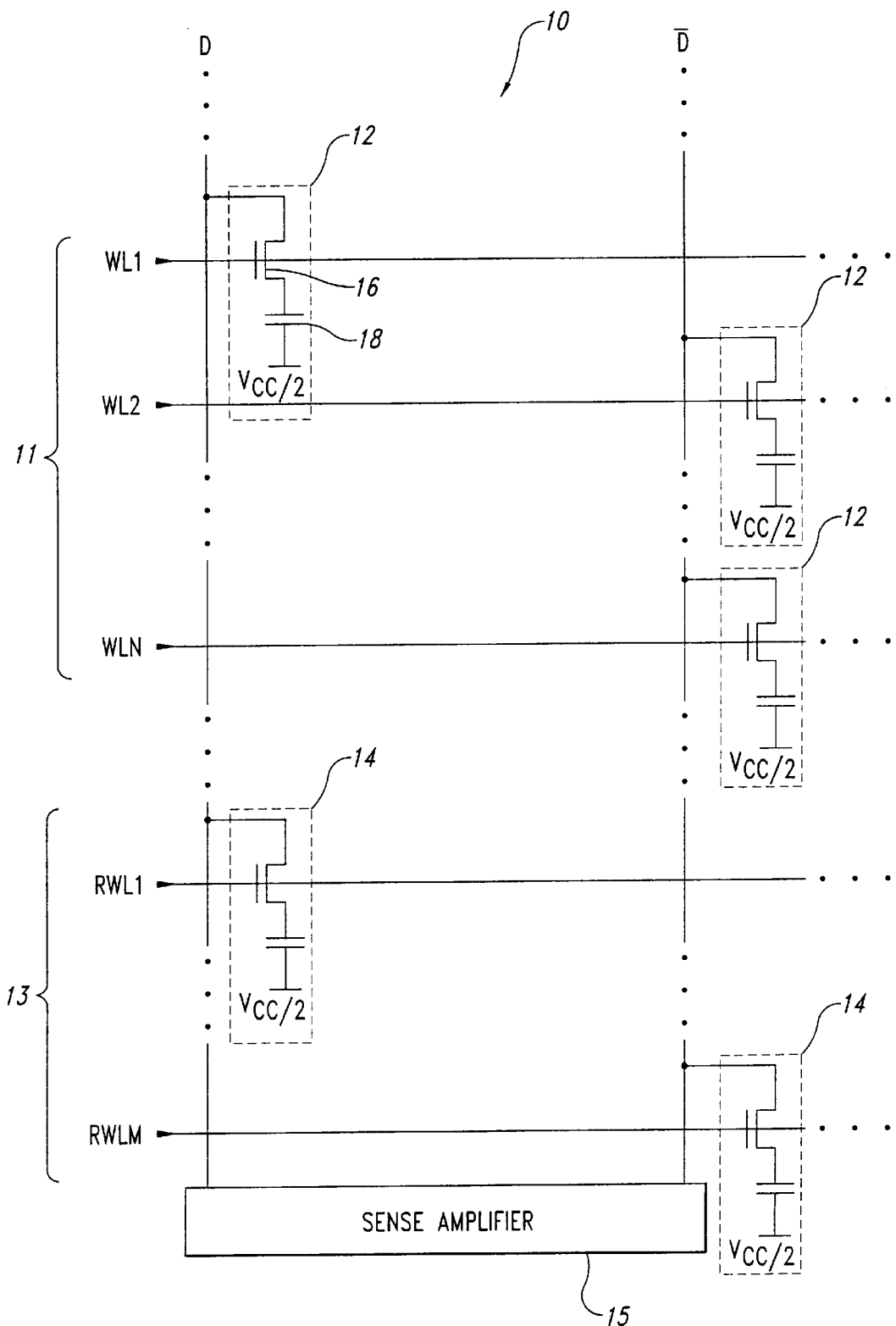
FIG. 1 is a schematic diagram of a portion of a conventional DRAM array.
Figure 2:
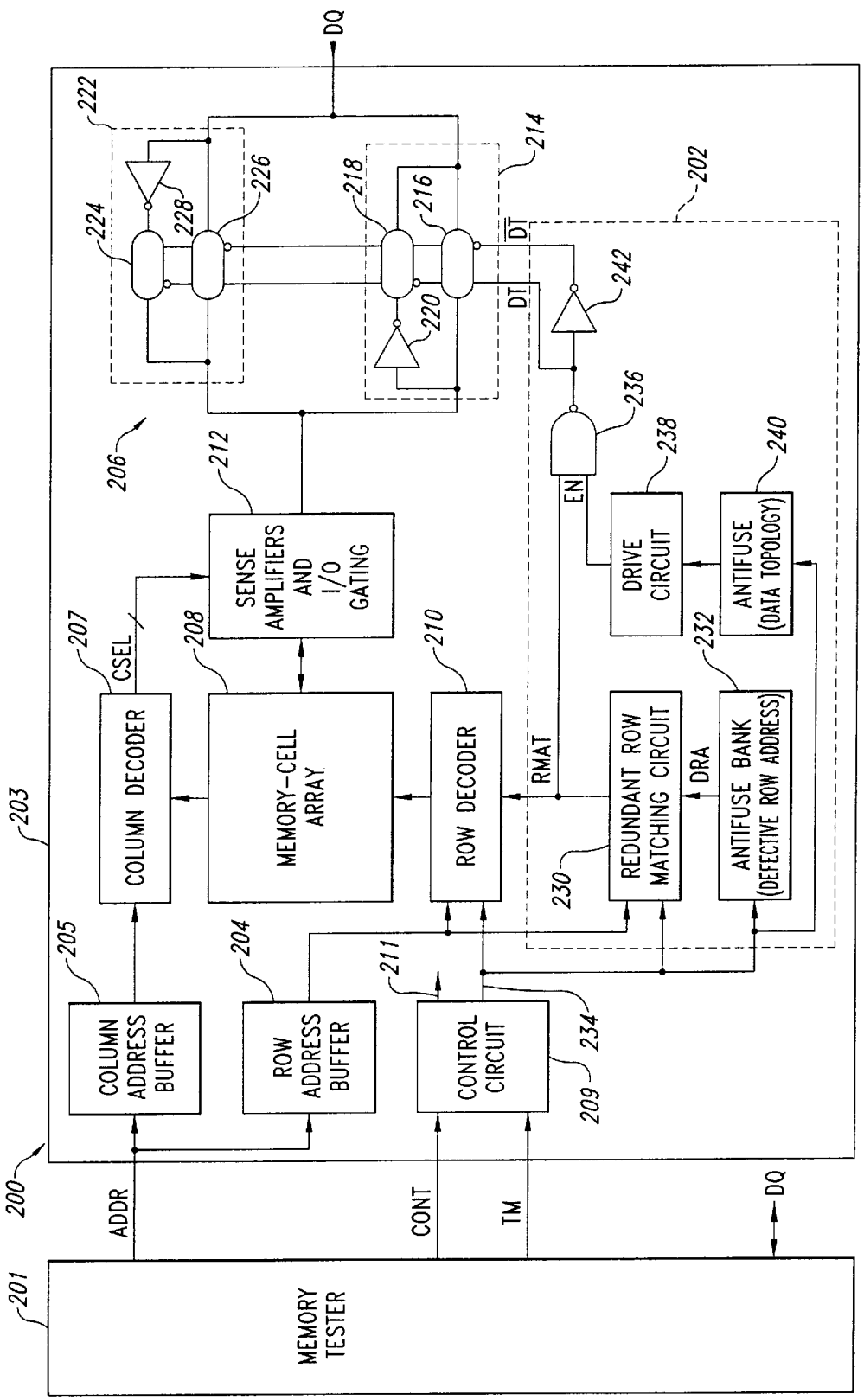
FIG. 2 is a block diagram of a test system including a memory device having a data topology circuit according to one embodiment of the present invention.

FIG. 2 is a block diagram of a test system 200 including a memory tester 201 and a DRAM 203 containing a data topology circuit 202 according to one embodiment of the present invention. In operation, the data topology circuit 202 operates in an initial test mode, a repair test mode, and a post-repair test mode. During the initial and repair test modes, the memory tester 201 detects defective memory cells in the DRAM 203 and programs the topology circuit 202 to store the locations of defective rows and the data topology of redundant rows replacing those rows. The data topology circuit 202 thereafter operates in the post-repair mode to adjust the data topology of the redundant row that is accessed in lieu of the defective row such that the data topology of the redundant row matches that of the defective row during subsequent testing of the DRAM 203, as will be explained in more detail below.

The memory tester 201 applies address, data, and control signals to the DRAM 203 on an address bus ADDR, data bus DQ, and control bus CONT, respectively. The control bus CONT normally includes a number of control signals such as a row address strobe signal $\overline{RAS}$, column address strobe signal $\overline{CAS}$, and write enable signal WE that the memory tester 201 develops to control data transfer to and from the DRAM 203. The memory tester 201 also applies a test mode signal TM to place the DRAM in the initial and post-repair test modes of operation. The test mode signal TM may be a logic level signal applied on a separate test terminal or a "supervoltage" applied on an existing terminal of the DRAM 203, or may be a sequence of control signals applied on the CONT bus such as applying the $\overline{RAS}$ signal before the $\overline{CAS}$ signal, as understood by those skilled in the art.

The DRAM 203 includes a row address buffer 204 that latches a row address applied on the address bus ADDR. A row decoder 210 decodes the latched row address from the row address buffer 204 and applies the decoded row address to activate the corresponding addressed row in a memory-cell array 208. The row decoder 210 further receives a row matching signal RMAT from the data topology circuit 202. In response to the RMAT signal going active, the row decoder 210 activates a redundant row of memory cells in the array 208 instead of a defective row corresponding to the row address received from the row address buffer 204, as will be explained in more detail below. A control circuit 209 receives the TM signal and control signals applied on the control bus CONT, and generates a plurality of control signals 211 and programming signals 234 responsive to these signals to control operation of the row decoder 210 and other components in the DRAM 203 during the normal and test modes of operation, as will be described in a more detail below. Briefly, the row decoder 210 is programmed responsive to the programming signals 234 during the repair mode to define the redundant row to be accessed when a row address corresponding to a defective row is received.

A column address buffer 205 latches a column address applied on the address bus ADDR and outputs the latched address to a column decoder 207.

The column decoder 207 decodes the latched column address and applies a decoded column address in the form of an activated column select signal CSEL to a sense amplifier and I/O gating circuit. In response to the activated CSEL signal, the sense amplifiers and I/O gating circuit 212 transfers data between data path circuitry 206 and addressed columns of memory cells in the activated row in the memory-cell array 208. More specifically, during a read data transfer operation, data stored in the addressed columns are transferred through the circuit 212 and through a data read path 214 to the data bus DQ where it is available to be read by the memory tester 201. As will be understood by one skilled in the art, the data read path 214 typically includes a data amplifier that receives data from the circuit 212 and applies this data to an output buffer and latch, which, in turn, places the read data on the data bus DQ. In FIG. 2, the data read path 214 is depicted functionally as merely including first and second pass gates 216 and 218 and an inverter 220 coupled between the circuit 212 and the data bus DQ as shown. The pass gates 216 and 218 receive a pair of complementary data topology control signals DT and $\overline{DT}$ from the data topology circuit 202. In operation, when the control signals DT and $\overline{DT}$ are high and low, respectively, the pass gate 218 turns OFF and pass gate 216 turns ON directly transferring data from the circuit 212 through the pass gate 216 to the data bus DQ. When the control signals DT and $\overline{DT}$ are low and high, respectively, the pass gate 216 turns OFF and the pass gate 218 turns ON transferring data from the circuit 212 through the inverter 220 and pass gate 218 to the data bus DQ. In this way, the pass gates 216 and 218 and inverter 220 function to adjust the data topology of the data read path 214 responsive to the control signals DT and $\overline{DT}$ from the data topology circuit 202, as will be explained in more detail below.

During a write data transfer operation, data applied on the data bus DQ is transferred through a data write path 222 to the circuit 212, which, in turn, applies the write data to the addressed memory cells in the activated row of the array 208 responsive to the activated CSEL signal. Once again, just as for the data read path 214, the data write path 222 typically contains a number of conventional components such as a data input buffer coupled to the data bus DQ and a data write driver that receives write data from the data input buffer and applies this data to the circuit 212, as will be understood by those skilled in the art. In FIG. 2, the data write path 222 is depicted functionally as including two pass gates 224 and 226 and an inverter 228 coupled as shown between the circuit 212 and the data bus DQ. The pass gates 224 and 226 receive the control signals DT and $\overline{\text{DT}}$ from the data topology circuit 202. In operation, when the control signals DT and $\overline{\text{DT}}$ are high and low, respectively, the pass gate 224 turns OFF and the pate gate 226 turns ON transferring data directly from the data bus DQ through the pass gate 226 to the circuit 212. When the control signals DT and $\overline{\text{DT}}$ are low and high, respectively, the pass gate 226 turns OFF and pass gate 224 turns ON transferring data applied on the bus DQ through the inverter 228 and pass gate 224 to the circuit 212. In this way, the pass gates 224, 226 and inverter 228 function to adjust the data topology of addressed memory cells in the array 208 responsive to the control signals DT and $\overline{\text{DT}}$ from the data topology circuit 202, as will be explained in more detail below.

Before describing the overall operation of the test system 200, the data topology circuit 202 will be described in more detail. The data topology circuit 202 includes a redundant row matching circuit 230 that receives the latched row address from the row address buffer 204. An antifuse bank 232 including a plurality of antifuses (not shown) applies a defective row address DRA to the matching circuit 230 and receives the programming signals 234 from the control circuit 209. The redundant row matching circuit 230 compares the latched row address from the row address buffer 204 to the defective row address DRA received from the bank 232 and develops the row matching signal RMAT responsive to this comparison. When the latched row address does not equal the defective row address DRA, the matching circuit 230 drives the RMAT signal inactive low. In contrast, when the latched row address matches the defective row address DRA the matching circuit 230 drives the RMAT signal active high. As previously described, when the RMAT signal is active high, the row decoder 210 activates a redundant row in the array 208 instead of the row corresponding to the defective row address DRA.

The individual antifuses in the bank 232 are selectively programmed responsive to programming signals 234 applied to the bank 232 to thereby set the value of the defective row address. As understood by those skilled in the art, an antifuse is programmed by applying a programming voltage having a sufficient magnitude across the terminals of the antifuse to "blow" the antifuse. Before being blown, each antifuse presents a high impedance between its terminals, and after being blown the antifuse presents a low impedance between its terminals. Each of the antifuses in the bank 232 represents one bit in the defective row address DRA, a blown antifuse representing a first binary value (e.g., "1") and an unblown antifuse representing a second binary value (e.g., "0"). During the repair test mode, the control circuit 209 applies the programming signals 234 to blow selected antifuses in the bank 232 causing the antifuses to collectively define the defective row address DRA. For example, assume the array 208 contains 1024 rows and that the row thirty-five contains a defective memory cell. In this situation, the bank 232 would include ten antifuses, each corresponding to one bit in the ten-bit row address required to access all of the 1024 rows. The control circuit 209 would apply the programming signals 234 to blow the first, second, and sixth antifuses so the defective row address DRA equals "0000100011.".

The data topology circuit 202 further includes a NAND gate 236 receiving on respective inputs the RMAT signal from the matching circuit 230 and an enable signal EN from a drive circuit 238. The drive circuit 238 is coupled to an antifuse 240 that is programmed by the programming signals 234 from the control circuit 209 in the same manner as previously described for the bank 232. When the antifuse 240 is not blown, the drive circuit 238 drives the enable signal EN inactive low disabling the NAND gate 236. In contrast, when the antifuse 240 is blown, the drive circuit 238 drives the EN signal active high enabling the NAND gate 236. The output from the NAND gate 236 is applied directly and through an inverter 242 to generate the complementary data topology signals DT and $\overline{\text{DT}}$. When the NAND gate 236 is disabled, the NAND gate drives its output high thereby driving the DT and $\overline{\text{DT}}$ signals high and low, respectively, which turns ON pass gates 216, 226 and turns OFF pass gates 218, 224 independent of the RMAT signal. When the NAND gate 236 is enabled, the state of the DT and $\overline{\text{DT}}$ signals and thus the state of the pass gates 216, 218, and 224, 226 is determined by the RMAT signal, as will be described in more detail below.

The overall operation of the test system 200 and the operation of the data topology circuit during testing of the DRAM 203 will now be described in more detail. To place the DRAM 203 in the initial test mode of operation, the memory tester 201 drives the TM signal active. In response to the active TM signal, the control circuit 209 generates the control signals 211 to control operation of components in the DRAM 203. The control circuit 209 also applies the signals 234 to disable the matching circuit 230 which, in turn, drives the RMAT signal inactive low. Thus, during the initial test mode, the RMAT signal is inactive low thereby disabling the circuit 202 and causing the row decoder 210 to access rows in the array 201 responsive to the latched row address from the buffer 204. In addition, the low RMAT signal also disables the NAND gate 236 which, in turn, drives the DT, $\overline{\text{DT}}$ signals high and low, respectively, turning ON pass gates 216, 226 and turning OFF pass gates 218, 224. The memory tester 201 thereafter applies address, data, and control signals on the respective ADDR, DQ, and CONT buses to write data to and read data from each of the memory cells in the array 208 and thereby verify the proper operation of each cell. The memory tester 201 first writes test data to each of the memory cells in the array 208. To write test data to the memory cells in the array 208, the memory tester 201 first applies a row address on the address bus ADDR, test data on the data bus DQ, and control signals that define a write command on the control bus CONT. The row address buffer 204 latches the row address responsive to the control signals 211 from the control circuit 209, and the latched row address from the buffer 204 is output to the row decoder 210. The row decoder 210 decodes the row address and activates the row of memory cells in the array 208 corresponding to the decoded row address. The memory tester 201 then applies a column address on the address bus ADDR, which is latched by the column address buffer 205 and output to the column decoder 207. The column decoder 207 decodes the latched column address and activates the CSEL signal corresponding to the decoded column address. At this point, the test write data applied on the data bus DQ is transferred through the activated pass gate 226 to the sense amplifiers and I/O gating circuitry 212 which, in turn, transfers the write data to the addressed memory cells in the array 208. The memory tester 201 repeats this process to write test data to each of the memory cells in the array 208.

After writing test data to each of the memory cells in the array 208, the memory tester 201 then reads this test data to verify that each cell has stored the proper value. To read test data from the memory cells in the array 208, the memory tester 201 once again applies a row address on the address bus ADDR, test data on the data bus DQ, and applies control signals corresponding to a read command on the control bus CONT. The row address buffer 204 latches the row address responsive to the control signals 211 from the control circuit 209, and the latched row address from the buffer 204 is output to the row decoder 210. The row decoder 210 decodes the row address and activates the row of memory cells in the array 208 corresponding to the decoded row address. At this point, the sense amplifiers and I/O gating circuitry 212 senses the data stored in the memory cells in the activated row. The memory tester 201 then applies a column address on the address bus ADDR, which is latched by the column address buffer 205 and output to the column decoder 207. The column decoder 207 decodes the latched column address and activates the CSEL signal corresponding to the decoded column address. In response to the active CSEL signal, the circuit 212 transfers the data stored in the addressed memory cells through the activated pass gate 216 to the data bus DQ where it is read by the memory tester 201.

During the initial test mode, the memory tester 201 compares the data written to each cell to that read from the memory cell to detect defective memory cells. For example, the memory tester 201 may first write a binary 1 into each of the memory cells in the array 208 and thereafter read this test data from each of the cells in the array 208 to verify that a binary 1 was in fact stored in the memory cells. After writing binary 1's to each memory cell, the memory tester 201 may then write binary 0's to each of the cells in the array, and thereafter read the data stored in each cell to ensure that a binary 0 was in fact stored. When the data written to a memory cell does not equal that read from the memory cell, the memory tester 201 determines that the memory cell is defective. The memory tester 201 may write a variety of different data patterns to the cells in the array 208 during testing in the initial test mode, as will be understood by those skilled in the art.

Once the memory tester 201 has detected all defective memory cells in the array 208, the tester commences the repair mode of operation. During the repair mode, the memory tester 201 applies control signals on the control bus CONT causing the control circuit 209 to generate the programming signals 234 to program selected ones of the antifuses in the bank 232 and possibly the antifuse 240, and also to program the repair solution into the address decoder 210, as will now be explained in more detail. More specifically, during the repair mode, the memory tester 201 has already identified each of the defective memory cells in the array 208. For the following example, assume that the memory tester 201 has detected a single defective memory cell in the array 208 and that this defective cell is contained in row N of the array. At this point, the memory tester 201 programs the antifuses in the bank 232 such that the bank 232 outputs the defective row address DRA having a value N corresponding to the defective row. By programming the bank 232 to output the defective row address DRA having the value N to the matching circuit 230, the memory tester 201 causes the matching circuit 230 to drive the RMAT signal active high whenever the row address N is applied to the DRAM 203. During the repair mode, the memory tester 201 also generates the programming signals 234 that cause the row decoder 210 to map the defective row address N to a redundant row address whenever the RMAT signal is active high, which occurs when the defective row address N is applied to the DRAM 203. The circuitry in the row decoder 210 for mapping the defective rows is well understood by those skilled in the art.

During the repair mode, the memory tester 201 also determines whether to program the antifuse 240. Before testing the DRAM 203, data topology information has been downloaded into the memory tester 201 so that it can determine the data topology of each row in the array 208. Thus, the memory tester 201 now determines the data topology of the redundant row compared to that of the defective row. When the data topologies are different, the memory tester 201 causes the control circuit 209 to generate the programming signals 234 to blow the antifuse 240. Recall, when the antifuse 240 is blown, the drive circuit 238 drives the EN signal active high thereby enabling the NAND gate 236. In contrast, if the data topologies are the same, the memory tester 201 does not cause the antifuse 240 to be blown so that the drive circuit 238 drives the EN signal inactive low disabling the NAND gate 236.

At this point, the memory tester 201 has completed operation in the repair mode. As previously discussed, a memory tester 201 having the capability to detect and store the addresses of defective memory cells and calculate the data topology for each of these memory cells is typically a relatively sophisticated and thus expensive piece of test equipment. Moreover, after the repair of the DRAM 203 by mapping the defective row to a redundant row, the memory tester 201 cannot use the same data topology equations since the data topology between the defective row and redundant row may not be the same. The data topology circuit 202 eliminates this situation, allowing the memory tester 201 or another less expensive memory tester to test the DRAM 203 after the repair mode using the same topology equations, as will now be described in more detail below.

After repair of the defective memory cells in the array 208, the memory tester 201 commences operation in the post-repair mode of operation and once again tests the DRAM 203 to ensure that it is operating properly. During the post-repair mode of operation, the memory tester 201 once again writes data to and reads data from each of the memory cells in the array 208 to verify proper operation. The data topology circuit 202 operates in one of two modes during the post-repair mode of operation, a normal mode and an adjustment mode. The data topology circuit 202 operates in the normal mode when the latched row address from the address buffer 204 does not equal the defective row address DRA. More specifically, during the normal mode, the memory tester 201 applies a row address on the address bus ADDR, and this row address is latched by the row address buffer 204 and output to the row decoder 210 and matching circuit 230. As previously described, when the latched row address from the buffer 204 does not equal the defective row address DRA from the bank 232, the matching circuit 230 drives the RMAT signal inactive low. Thus, during the normal mode, the data topology circuit 202 drives the RMAT signal inactive low since each latched row address output from the buffer 204 does not equal the defective row address DRA.

In response to the low RMAT signal, the NAND gate 236 drives its output high thereby driving the DT and $\overline{DT}$ signals high and low, respectively. When the DT and $\overline{DT}$ signals are high and low, respectively, the pass gates 218 and 224 turn OFF and the pass gates 216 and 226 turn ON. As a result, read data is transferred directly from the circuit 212 through the turned ON pass gate 216 to the data bus DQ, and write data is transferred directly from the data bus DQ through the turned ON pass gate 226 to the circuit 212. Thus, during the normal mode, the data topology circuit 202 maintains the DT and $\overline{DT}$ signals high and low, respectively, so that the data topology for each of the memory cells in the array 208 is unaffected by the inverter 220 in the data read path 214 and the inverter 228 in the data write path 206. In this way, during the normal mode, the memory tester 201 merely transfers data to and from memory cells in the array 208 using the initially calculated data topology equations.

During the post-repair mode, the data topology circuit 202 operates in the adjustment mode in response to the memory tester 201 attempting to transfer data to or from a defective row of memory cells in the array 208. More specifically, during the adjustment mode the memory tester 201 applies the defective row address DRA on the address bus ADDR, and this defective row address is latched by the buffer 204 and output to the row decoder 210 and matching circuit 230. In response to the latched defective row address DRA from the buffer 204, the matching circuit 230 drives the RMAT signal active high indicating the latched row address corresponds to the defective row address DRA. In response to the active high RMAT signal, the row decoder 210 activates the redundant row of memory cells in the array 208 that has been mapped to the defective row address DRA, as previously described. The NAND gate 236 also receives the active high RMAT signal. Recall, when the data topologies of the defective row and the redundant row mapped to replace that row are the same, the antifuse 240 was not blown during the repair mode. When the antifuse 240 is not blown, the drive circuit 238 drives the enable signal EN inactive low, disabling the NAND gate 236. As a result, the NAND gate 236 maintains its output high, driving the DT and $\overline{DT}$ signals high and low, respectively, and thereby turning ON pass gates 216, 226 and turning OFF pass gates 218, 224. In this way, the data topology circuit 202 does not adjust the data topology of the redundant row when it has the same topology as the defective row it is replacing.

When the data topologies between the redundant row and the defective row are different, however, the antifuse 240 has been programmed during the repair mode, causing the drive circuit 238 to drive the EN signal active high enabling the NAND gate 236. When enabled, the NAND gate 236 drives its output low responsive to the active high RMAT signal. The low output from the NAND gate 236 drives the DT and $\overline{DT}$ signals low and high, respectively, turning OFF the pass gates 216, 226 and turning ON the pass gates 218, 224. As a result, read data from the circuit 212 is now applied through the inverter 220 and pass gate 218 to the data bus DQ, and write data is transferred from the data bus DQ through the inverter 228 and pass gate 224 to the circuit 212.

By inserting the invelter 220 in the data read path 214 and the inverter 228 in the data write path 222, the data topology of the redundant row is thereby adjusted so that it is the same as the data topology of the defective row that it replaced. The single inverters 220, 228 in the data read and write paths 214, 222 complement the data that would normally be read from and written to the memory cells in the redundant row, thereby adjusting the data topology of these cells. In this way, the memory tester 201 may utilize the same data topology equations in transferring data to and from the array 208 even when the data topology of the defective row and the redundant row mapped to replace that defective row are different. This enables the memory tester 201 to reliably test the DRAM 203 after redundant rows have been mapped to replace defective rows without having to calculate new data topology equations to adjust for the differences in data topologies between the defective rows and the redundant rows.

In the DRAM 203, the components such as the address buffers 204, 205, control circuit 209, decoders 207, 210, array 208, and circuit 212 may all be formed from circuitry that is well within the scope of those skilled in the art. Moreover, the matching circuit 230 and drive circuit 238 may be formed from a variety of different circuits within the scope of those skilled in the art. The bank 232 and antifuse 240 may also be formed from different components that perform the same function. For example, instead of antifuses, each of these components may include laser fuses or other components that may be programmed during the repair mode to store the required information. In addition, although the data topology circuit 202 has been described as being separate from the components 216–220 in the read path 214 and components 224–228 in the write path 222, such components may also be considered part of the data topology circuit 202.

Figure 3:
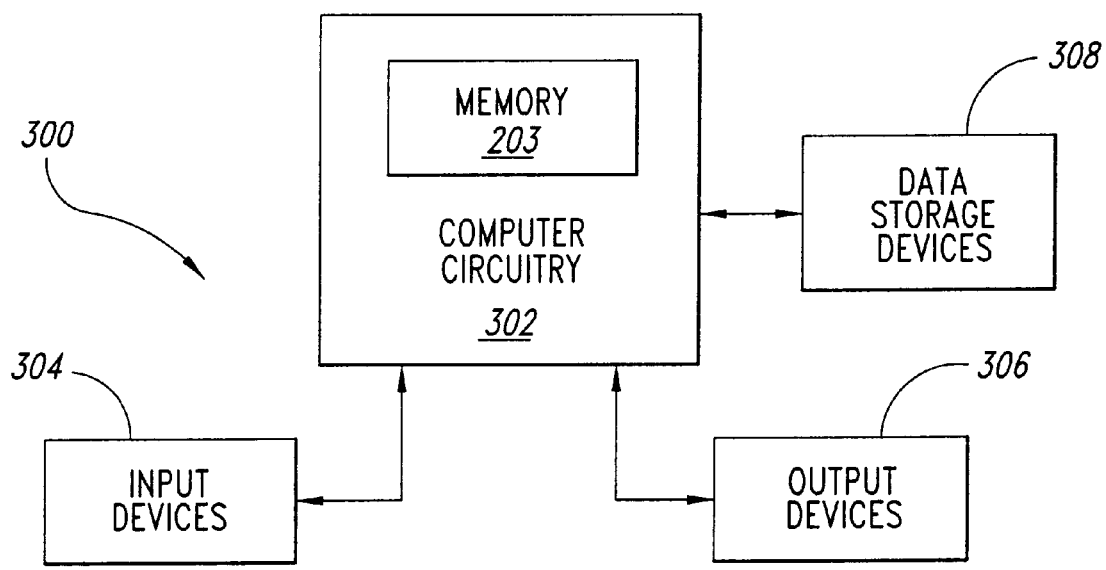
FIG. 3 is a block diagram of computer system including the memory device of FIG. 3.

FIG. 3 is a block diagram of a computer system 300 including computing circuitry 302 that contains the memory device 203 of FIG. 2. The computing circuitry 302 performs various computing functions, such as executing specific software to perform specific calculations or tasks. In addition, the computer system 300 includes one or more input devices 304, such as a keyboard or a mouse, coupled to the computer circuitry 302 to allow an operator to interface with the computer system. Typically, the computer system 300 also includes one or more output devices 306 coupled to the computer circuitry 302, such output devices typically being a printer or a video terminal. One or more data storage devices 308 are also typically coupled to the computer circuitry 302 to store data or retrieve data from external storage media (not shown). Examples of typical storage devices 308 include hard and floppy disks, tape cassettes, and compact disc read-only memories (CD-ROMs). The computer circuitry 302 is typically coupled to the memory device 203 through appropriate address, data, and control busses to provide for writing data to and reading data from the memory device.

It is to be understood that although various embodiments of the present invention have been set forth in the foregoing description, the above disclosure is illustrative only, and changes may be made in detail while remaining within the broad principles of the invention. For example, some of the components described above may be implemented using either digital or analog circuitry, or a combination of both, and also, where appropriate, may be realized through software executing on suitable processing circuitry. Accordingly, the present invention is to be limited only by the appended claims.

I claim:

1. An integrated circuit, comprising:

a memory-cell array including a plurality of memory cells arranged in rows and columns, the array including at least one redundant memory cell and each of the memory cells having an associated data topology;

a data path circuit coupled between an external data terminal and the memory-cell array, the data path circuit operable to ti-ansfer data between the external terminal and the array, the data topology between data on the external terminal and data at the array being adjusted responsive to a data topology signal;

an address decoder having an input adapted to receive an address applied on an address bus and having a terminal coupled to receive a matching signal, the address decoder operable when the matching signal is inactive to access memory cells in the memory-cell array corresponding to the applied address, and operable when the matching signal is active to access a predetermined redundant memory cell in the array;

a programmable data topology element having a programmed state and an unprogrammed state; and a data topology circuit coupled to the address bus, address decoder, data path circuit, and the programmable data topology element, the data topology circuit operable responsive to the address having a predetermined value to apply an active matching signal to the decoder to access a predetermined redundant memory cell in the array, and operable responsive to the matching signal being active and the state of the programmable topology element to apply the data topology signal to the data path circuit to adjust the data topology of the accessed redundant memory cell.

2. The integrated circuit of claim 1 wherein the memory-cell array comprises at least one redundant row of memory cells and the data topology circuit applies the active matching signal to the row address decoder responsive to the row address having a predetermined value and the row address decoder accesses a redundant row responsive to the matching signal going active, the data topology circuit being operable responsive to the matching signal going active and the state of the programmable data topology element to apply the data topology signal to the data path circuit to adjust the data topology of the accessed redundant row.

3. The integrated circuit of claim 1 wherein the integrated circuit comprises a dynamic random access memory.

4. The integrated circuit of claim 1 wherein the programmable data topology element comprises an antifuse.

5. The integrated circuit of claim 4 wherein the data path circuit transfers the complement of data from the accessed redundant memory cell in the array onto the external data terminal and the complement of data on the external terminal to the array responsive to the topology signal being active, and the data topology circuit drives the topology signal active responsive to the matching signal being active and the antifuse being blown.

6. The integrated circuit of claim 1 wherein the data topology circuit comprises:

a plurality of antifuses being programmed to collectively define a redundant address;

a matching circuit having an input adapted to receive the address applied on the address bus and being coupled to the address decoder and the antiflises, the matching circuit applying the active matching signal to the address decoder responsive to the address applied on the address bus having a value corresponding to the redundant address; and a logic circuit coupled to the matching circuit and coupled to the programmable data topology element, the logic circuit applying the data topology signal to the data path circuit responsive to the state of the programmable topology element and the matching signal being active.

7. An integrated circuit, comprising:

a memory-cell array including a plurality of memory cells arranged in rows and columns, the array including at least one redundant memory cell;

an address bus adapted to receive address signals;

a data bus adapted to receive data signals;

a programmable data topology element having a programmed state and an unprogrammed state;

a complement circuit coupled between the data bus and the array and having a complement terminal adapted to receive a complement signal, the complement circuit operable to apply write data on the data bus to the array, the write data applied to the array having a first and second states relative to the data applied on the data bus when the complement signal is inactive and active, respectively, and the data complement circuit operable to apply read data from the array to the data bus, the data applied on the data bus having a first and second states relative to the data from the array when the complement signal is inactive and active, respectively, each of the second states being the complement of the corresponding first state;

an address decoder coupled to the address bus and having a terminal adapted to receive a matching signal, the address decoder operable to access memory cells in the memory-cell array corresponding to the address signals when the matching signal is inactive, and operable when the matching signal is active to access redundant memory cells; and a data topology circuit coupled to the complement circuit and coupled to the programmable data topology element, the data topology circuit operable when the address signals do not have the predetermined value to drive the matching and complement signals inactive so the address decoder accesses memory cells corresponding to the address signals, and operable when the address signals have the predetermined value to drive the matching signal active and to drive the complement signal active responsive to the matching signal going active and the programmable element being programmed so the address decoder accesses redundant memory cells and the complement circuit adjusts the data topology of those redundant cells responsive to the complement signal.

8. The integrated circuit of claim 7 wherein the integrated circuit comprises a dynamic random access memory.

9. The integrated circuit of claim 7 wherein the programmable topology element comprises an antifuse.

10. The integrated circuit of claim 7 wherein the data topology circuit comprises:

a plurality of antifuses that are programmed to collectively define a redundant address;

a matching circuit having an input adapted to receive the address applied on the address bus and being coupled to the address decoder and the antifuses, the matching circuit generating the active matching signal responsive to the address applied on the address bus having a value corresponding to the redundant address; and a logic circuit coupled to the matching circuit and coupled to the programmable data topology element, the logic circuit applying the complement signal to the complement circuit responsive to the state of the programmable data topology element when the matching signal is active.

11. An integrated circuit, comprising:

a memory-cell array;

a redundant memory-cell array;

a data path circuit coupled between an external data terminal and the memory-cell array and having a data topology terminal;

an address decoder coupled to an address bus and coupled to the array, the address decoder having a matching terminal;

a data topology circuit coupled to the address bus and the matching terminal of the address decoder, and further coupled to the topology terminal of the data path circuit; and a programmable data topology element coupled to the data topology circuit.

12. The integrated circuit of claim 11 wherein the integrated circuit comprises a dynamic random access memory.

13. The integrated circuit of claim 11 wherein the programmable data topology element comprises an antifuse.

14. The integrated circuit of claim 11 wherein the data topology circuit comprises:
- a bank of address programmable elements;
- a matching circuit coupled to the address bus, the address decoder, and the bank of programmable address elements; and
- a logic circuit coupled to the matching circuit and coupled to the programmable data topology element.

15. A memory device, comprising:
- an address bus;
- a control bus;
- a data bus;
- a memory-cell array including a plurality of memory cells arranged in rows and columns, the array including at least one redundant memory cell and each of the memory cells having an associated data topology;
- a data path circuit coupled between an external data terminal and the memory-cell array, the data path circuit operable to transfer data between the external terminal and the array, the data topology between data on the external terminal and data at the array being adjusted responsive to a data topology signal;
- an address decoder having an input adapted to receive an address applied on an address bus and having a terminal coupled to receive a matching signal, the address decoder operable when the matching signal is inactive to access memory cells in the memory-cell array corresponding to the applied address, and operable when the matching signal is active to access a predetermined redundant memory cell in the array;
- a programmable data topology element having a programmed state and an unprogrammed state;
- a data topology circuit coupled to the address bus, address decoder, data path circuit, and the programmable data topology element, the data topology circuit operable responsive to the address having a predetermined value to apply an active matching signal to the decoder to access a predetermined redundant memory cell in the array, and operable responsive to the matching signal being active and the state of the programmable topology element to apply the data topology signal to the data path circuit to adjust the data topology of the accessed redundant memory cell; and
- a control circuit coupled to the control bus, memory-cell array, address decoder, data path circuit, and data topology circuit, the control circuit operable in a normal mode responsive to control signals applied on the control bus to generate control signals to transfer data to and from the memory device, and operable in a test mode responsive to control signals applied on the control bus to generate programming signals to program the programmable data topology element to adjust the data topology of redundant memory cells.

16. The memory device of claim 15 wherein the memory device comprises a dynamic random access memory.

17. A test system, comprising:
- a memory device, comprising,
  - an address bus;
  - a control bus;
  - a data bus;
  - a memory-cell array including a plurality of memory cells arranged in rows and columns, the array including at least one redundant memory cell and each of the memory cells having an associated data topology;
  - a data path circuit coupled between an external data terminal and the memory-cell array, the data path circuit operable to transfer data between the external terminal and the array, the data topology between data on the external terminal and data at the array being adjusted responsive to a data topology signal;
  - an address decoder having an input adapted to receive an address applied on an address bus and having a terminal coupled to receive a matching signal, the address decoder operable when the matching signal is inactive to access memory cells in the memory-cell array corresponding to the applied address, and operable when the matching signal is active to access a predetermined redundant memory cell in the array;
  - a programmable data topology element having a programmed state and an unprogrammed state;
  - a data topology circuit coupled to the address bus, address decoder, data path circuit, and the programmable data topology element, the data topology circuit operable responsive to the address having a predetermined value to apply an active matching signal to the decoder to access a predetermined redundant memory cell in the array, and operable responsive to the matching signal being active and the state of the programmable topology element to apply the data topology signal to the data path circuit to adjust the data topology of the accessed redundant memory cell;
  - a control circuit coupled to the control bus, memory-cell array, address decoder, data path circuit, and data topology circuit, the control circuit operable in a normal mode responsive to control signals applied on the control bus to generate control signals to transfer data to and from the memory device, and operable in a test mode responsive to control signals applied on the control bus to generate programming signals to program the programmable data topology element to adjust the data topology of redundant memory cells; and
- a memory tester coupled to the address, data, and control buses of the memory device, the memory tester operable in an initial test mode to apply signals on the control bus to place the memory device in a test mode of operation and to transfer data to and from memory cells in the array to test those memory cells, operable in a repair mode to apply control signals on the control bus to replace defective memory cells with redundant memory cells and to control the control circuit to program the programmable data topology element to set the data topology of the redundant memory cells, and the memory tester operable in a post-repair mode to transfer data to and from the memory cells to test those memory cells.

18. The test system of claim 17 wherein the memory device comprises a dynamic random access memory.

19. A computer system, comprising:
- a data input device;
- a data output device; and
- a processor coupled to the data input and output devices, the processor including a memory device comprising,
  - an address bus;
  - a control bus;
  - a data bus;
  - a memory-cell array including a plurality of memory cells arranged in rows and columns, the array including at least one redundant memory cell and each of the memory cells having an associated data topology;

a data path circuit coupled between an external data terminal and the memory-cell array, the data path circuit operable to transfer data between the external terminal and the array, the data topology between data on the external terminal and data at the array being adjusted responsive to a data topology signal;

an address decoder having an input adapted to receive an address applied on an address bus and having a terminal coupled to receive a matching signal, the address decoder operable when the matching signal is inactive to access memory cells in the memory-cell array corresponding to the applied address, and operable when the matching signal is active to access a predetermined redundant memory cell in the array;

a programmable data topology element having a programmed state and an unprogrammed state;

a data topology circuit coupled to the address bus, address decoder, data path circuit, and the programmable data topology element, the data topology circuit operable responsive to the address having a predetermined value to apply an active matching signal to the decoder to access a predetermined redundant memory cell in the array, and operable responsive to the matching signal being active and the state of the programmable topology element to apply the data topology signal to the data path circuit to adjust the data topology of the accessed redundant memory cell; and a control circuit coupled to the control bus, memory-cell array, address decoder, data path circuit, and data topology circuit, the control circuit operable in a normal mode responsive to control signals applied on the control bus to generate control signals to transfer data to and from the memory device, and operable in a test mode responsive to control signals applied on the control bus to generate programming signals to program the programmable data topology element to adjust the data topology of redundant memory cells.

20. The computer system of claim 19 wherein the memory device comprises a dynamic random access memory.

21. A method for adjusting the data topology of redundant memory cells utilized to replace defective memory cells in a memory device, each redundant memory cell having a corresponding data topology relative to the defective memory cell, comprising:

detecting defective memory cells;

replacing the defective memory cells with redundant memory cells;

storing a topology bit in the memory device, the topology bit having a value indicative of the topology of the redundant memory cell relative to the replaced defective memory cell; and adjusting the data topology of the redundant memory cell to match that of the replaced defective cell responsive to the topology bit.

22. The method of claim 21 wherein adjusting the data topology occurs only while the memory device operates in a test mode of operation.

23. The method of claim 21 wherein replacing the defective memory cells with redundant memory cells comprises replacing a row of memory cells containing at least one defective memory cell with a redundant row of memory cells.

24. The method of claim 21 wherein storing a topology bit comprises calculating external to the memory device the topology of the redundant memory cell, comparing the calculated topology of the redundant cell to the topology of the replaced defective memory cell, setting the topology bit when the topologies comparison indicates the topologies are different, and complementing data transferred between the redundant memory cell and a data bus of the memory device responsive to the topology bit being set.

25. A method for testing a memory device including a memory-cell array having a plurality of memory cells arranged in rows and columns, the array including redundant rows of memory cells, and memory cells in each row including redundant rows having a corresponding data topology, comprising:

placing the memory device in a test mode;

transferring data to and from the memory cells in the array;

detecting defective memory cells from the transferred data;

mapping each defective row of memory cells including at least one defective memory cell to a respective redundant row;

storing a topology bit in the memory device for each mapped redundant row, each topology bit having a value determined by the data topology of the redundant row relative to the data topology of the replaced defective row;

detecting when a row address corresponding to the row address of one of the defective rows is applied to the memory device;

adjusting the data topology of the redundant row mapped to replace the corresponding defective row responsive to the corresponding topology bit so the topology of the redundant row matches that of the replaced defective row; and transferring data to and from memory cells in that redundant row.

26. The method of claim 25 wherein adjusting the data topology occurs only while the memory device operates in a test mode of operation.

27. The method of claim 25 wherein detecting comprises programming a plurality of groups of redundancy elements, each group of elements collectively defining the row address of a corresponding defective row, and comparing the row address applied to the memory device to the row addresses defined by the groups of redundancy elements.

* * * * *

UNITED STATES PATENT AND TRADEMARK OFFICE
CERTIFICATE OF CORRECTION

PATENT NO. : 6,097,644
DATED : August 1, 2000
INVENTOR(S) : Brian Shirley

It is certified that error appears in the above-identified patent and that said Letters Patent is hereby corrected as shown below:

Column 10,
Line 56, change "operable to ti-ansfer data" to -- operable to transfer data --

Column 11,
Line 43, change "and the antiflises, the" to -- and the antifuses, the --

Signed and Sealed this

Eighteenth Day of December, 2001

Attest:

Attesting Officer

JAMES E. ROGAN
Director of the United States Patent and Trademark Office